(12) United States Patent
Nejadpak et al.

(10) Patent No.: US 12,640,728 B2
(45) Date of Patent: May 26, 2026

(54) INTRINSICALLY POWERED, TUNABLE, SHORT-CIRCUIT DETECTION AND PROTECTION FOR SILICON CARBIDE FIELD EFFECT TRANSISTORS

(71) Applicant: Blue Origin Manufacturing, LLC, Huntsville, AL (US)

(72) Inventors: Arash Nejadpak, Everett, WA (US); Jacob Hoxsey Fenton, Gilbert, AZ (US)

(73) Assignee: Blue Origin Manufacturing, LLC, Huntsville, AL (US)

( * ) Notice: Subject to any disclaimer, the term of this patent is extended or adjusted under 35 U.S.C. 154(b) by 195 days.

(21) Appl. No.: 18/674,842

(22) Filed: May 25, 2024

(65) Prior Publication Data

US 2025/0364982 A1    Nov. 27, 2025

(51) Int. Cl.
H03K 17/082 (2006.01)
H03K 17/14 (2006.01)

(52) U.S. Cl.
CPC ....... H03K 17/0822 (2013.01); H03K 17/145 (2013.01); *H03K 2217/0027* (2013.01); *H03K 2217/0081* (2013.01)

(58) Field of Classification Search
CPC ............. H03K 17/0822; H03K 17/145; H03K 2217/0027; H03K 2217/0081
See application file for complete search history.

(56) References Cited

U.S. PATENT DOCUMENTS

| | | | | | |
|---|---|---|---|---|---|
| 5,563,759 | A | * | 10/1996 | Nadd | H03K 17/0822 |
| | | | | | 361/103 |
| 2016/0028219 | A1 | * | 1/2016 | Habu | H03F 3/217 |
| | | | | | 361/101 |
| 2018/0048141 | A1 | * | 2/2018 | Suzuki | H02M 1/32 |
| 2020/0144998 | A1 | * | 5/2020 | Inoue | H03K 17/18 |

OTHER PUBLICATIONS

IEEE Xplore Digital Library [online]. J. Person "Short Circuit Detection Methods for Silicon Carbide (SiC) Power Semiconductors," Retrieved on 2019. Retrieved from the Internet: <https://ieeexplore.ieee.org/stamp/stamp.jsp?tp=&arnumber=8767500> (Year: 2019).*
Haihong Qin, Haoxiang Hu, Wenxin Huang, Yubin Mo, Wenming Chen, "An improved desaturation short-circuit protection method for SiC power modules," Energy Reports v. 8 (2022) pp. 1383-1390.

* cited by examiner

*Primary Examiner* — Scott Bauer
*Assistant Examiner* — Nicolas Bellido
(74) *Attorney, Agent, or Firm* — Summit Patents, PC

(57) ABSTRACT

Electrical circuits and methods for protecting a semiconductor switch in response to detecting a short-circuit condition of the semiconductor switch are presented. An electrical circuit includes a latch-reset portion that disables or enables the semiconductor switch by connecting or disconnecting, respectively, a gate of the semiconductor switch to a source of the semiconductor switch. The circuit also includes a power source portion that is energized by a voltage pulse that drives the gate of the semiconductor switch. The power source portion provides voltage and current to other parts of (Continued)

the circuit so that no external voltage source is needed to operate the circuit. The semiconductor switch may be a silicon carbide MOSFET, which may have a threshold voltage that changes with temperature and age. The circuit can account for such changes.

20 Claims, 4 Drawing Sheets

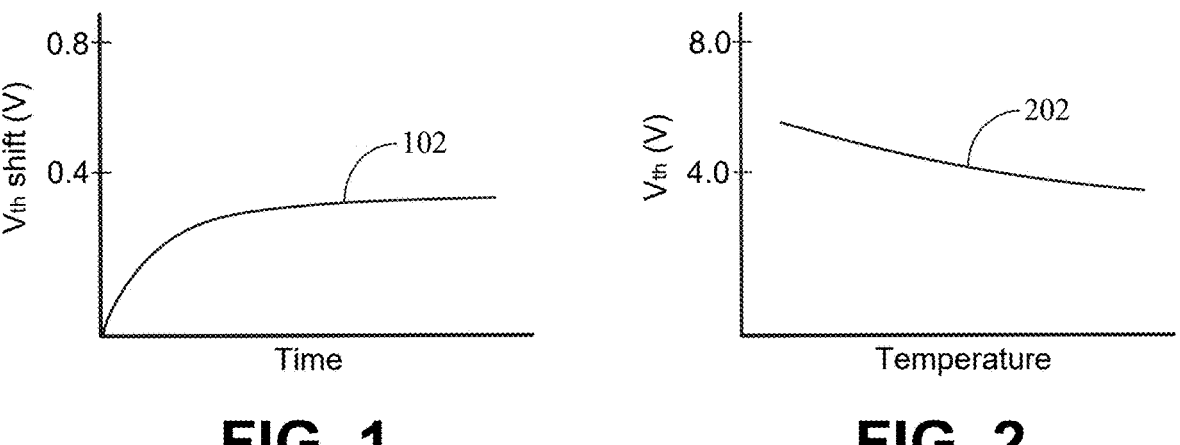
FIG. 1
FIG. 2
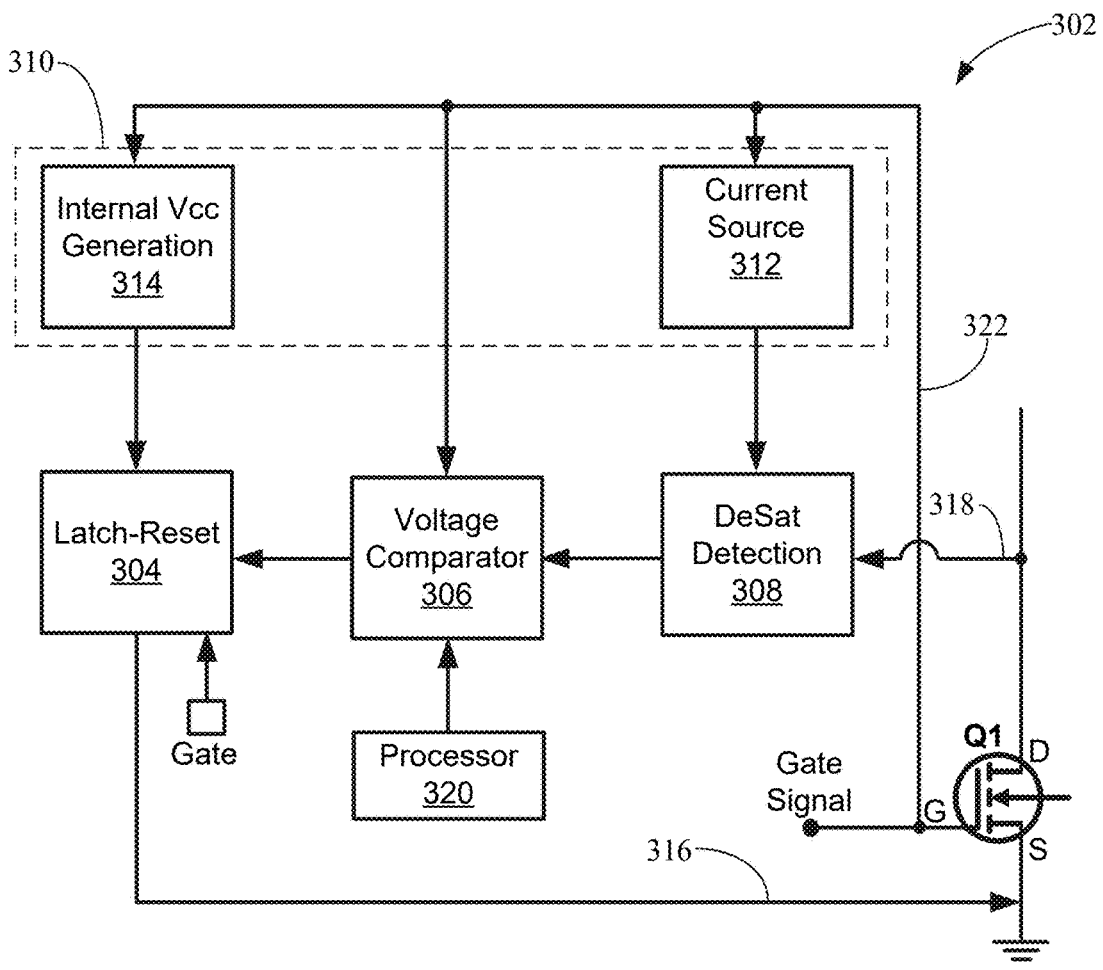
FIG. 3

Establish short-
circuit condition

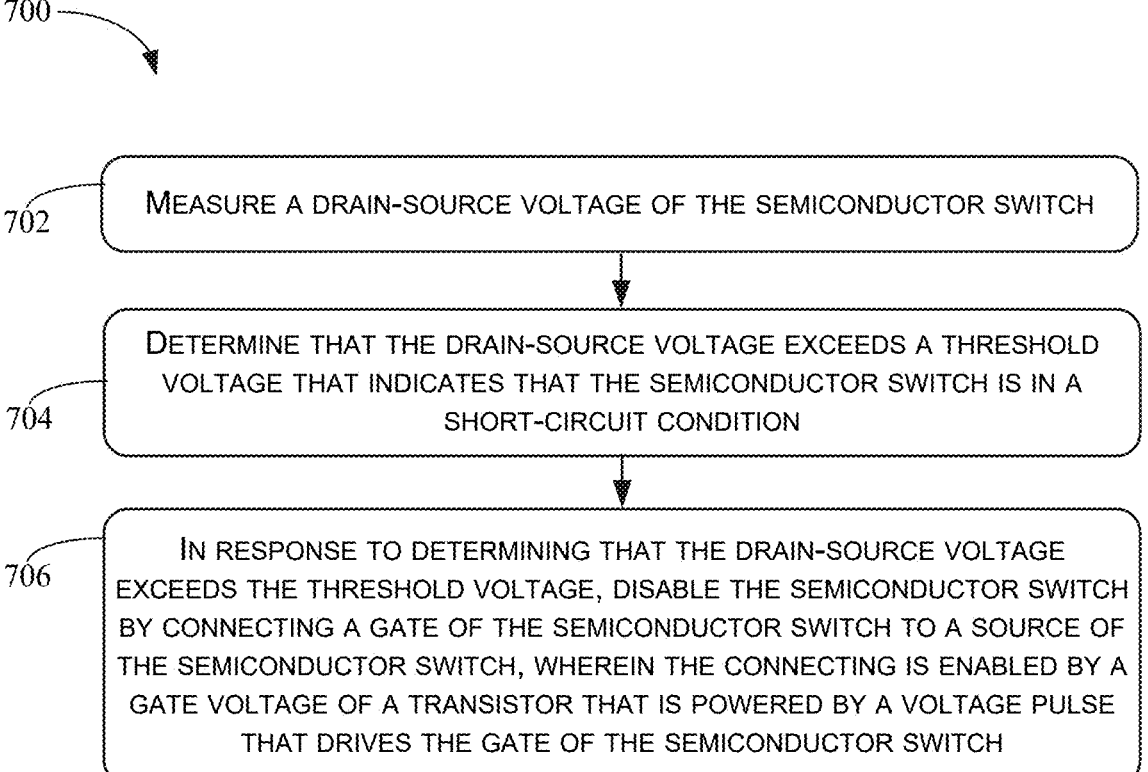

700

702   MEASURE A DRAIN-SOURCE VOLTAGE OF THE SEMICONDUCTOR SWITCH

704   DETERMINE THAT THE DRAIN-SOURCE VOLTAGE EXCEEDS A THRESHOLD VOLTAGE THAT INDICATES THAT THE SEMICONDUCTOR SWITCH IS IN A SHORT-CIRCUIT CONDITION

706   IN RESPONSE TO DETERMINING THAT THE DRAIN-SOURCE VOLTAGE EXCEEDS THE THRESHOLD VOLTAGE, DISABLE THE SEMICONDUCTOR SWITCH BY CONNECTING A GATE OF THE SEMICONDUCTOR SWITCH TO A SOURCE OF THE SEMICONDUCTOR SWITCH, WHEREIN THE CONNECTING IS ENABLED BY A GATE VOLTAGE OF A TRANSISTOR THAT IS POWERED BY A VOLTAGE PULSE THAT DRIVES THE GATE OF THE SEMICONDUCTOR SWITCH

FIG. 7

INTRINSICALLY POWERED, TUNABLE, SHORT-CIRCUIT DETECTION AND PROTECTION FOR SILICON CARBIDE FIELD EFFECT TRANSISTORS

BACKGROUND

A metal-oxide-semiconductor field-effect transistor (MOSFET), which is a particular type of field-effect transistor (FET), and an insulated gate bipolar transistor (IGBT) are power semiconductor devices that are used in various circuit applications such as DC-DC converters, DC-AC Inverters, AC-DC and other variations of power converters, electric motor drives and controllers, just to name a few examples.

Silicon Carbide (SiC) MOSFETs have recently become a potential substitute for silicon (Si) IGBTs. The introduction of these SiC devices, which can operate at higher temperatures and higher power densities compared to their Si counterparts, has brought new possibilities and new challenges for design engineers. The capability of operating at higher power densities sets forth the issue of how long a SiC power device can sustain a short-circuit fault. Regardless of the short-circuit robustness of these devices, a short-circuit fault condition should be eliminated as soon as detected to preserve the device from degradation or destruction. Compared to Si IGBTs, SiC MOSFETs generally have more stringent short-circuit protection requirements. To make the most use of SiC MOSFETs and ensure a robust system operation, a fast and reliable short-circuit protection circuit is needed.

Desaturation detection methods are used for power semiconductor devices such as IGBTs to address short-circuit conditions or shoot-through current occurrences. In these methods, when a short-circuit occurs, the drain-source voltage of the device charges part of a circuit (e.g., that involves a capacitor) to a threshold voltage, which is then compared to a reference voltage to identify the short-circuit condition. These methods may be highly effective for IGBTs because the threshold voltage has a narrow tolerance for temperature variations and aging. However, such is not the case for SiC MOSFETs, which have different characteristics and the tolerance of their threshold voltage to temperature variations and aging is wider than that of IGBTs, for example.

IGBT devices are typically not suitable for use in space applications due to the harmful effects of solar radiation. SiC MOSFETS, however, are not adversely affected in this way. Thus SiC MOSFETS may be used in circuits that will be used in space. This being the case, if SiC devices are to be used, then a demand arises for a radiation-hardened short-circuit detection circuit that can be tailored for different types of SiC devices and their expected lifespan.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1 is a plot illustrating a shift in threshold gate voltage over operation lifetime of a SiC MOSFET, according to some embodiments.

FIG. 2 is a plot illustrating a change in threshold gate voltage with respect to changes in temperature of a SiC MOSFET, according to some embodiments.

FIG. 3 is a system block diagram of a circuit for detecting a short-circuit condition of a semiconductor switch, such as a SiC MOSFET, according to some embodiments.

FIG. 7 is a flow diagram of a method for protecting a semiconductor switch in response to detecting a short-circuit condition of the semiconductor switch, according to some embodiments.

DETAILED DESCRIPTION

Figure 4:
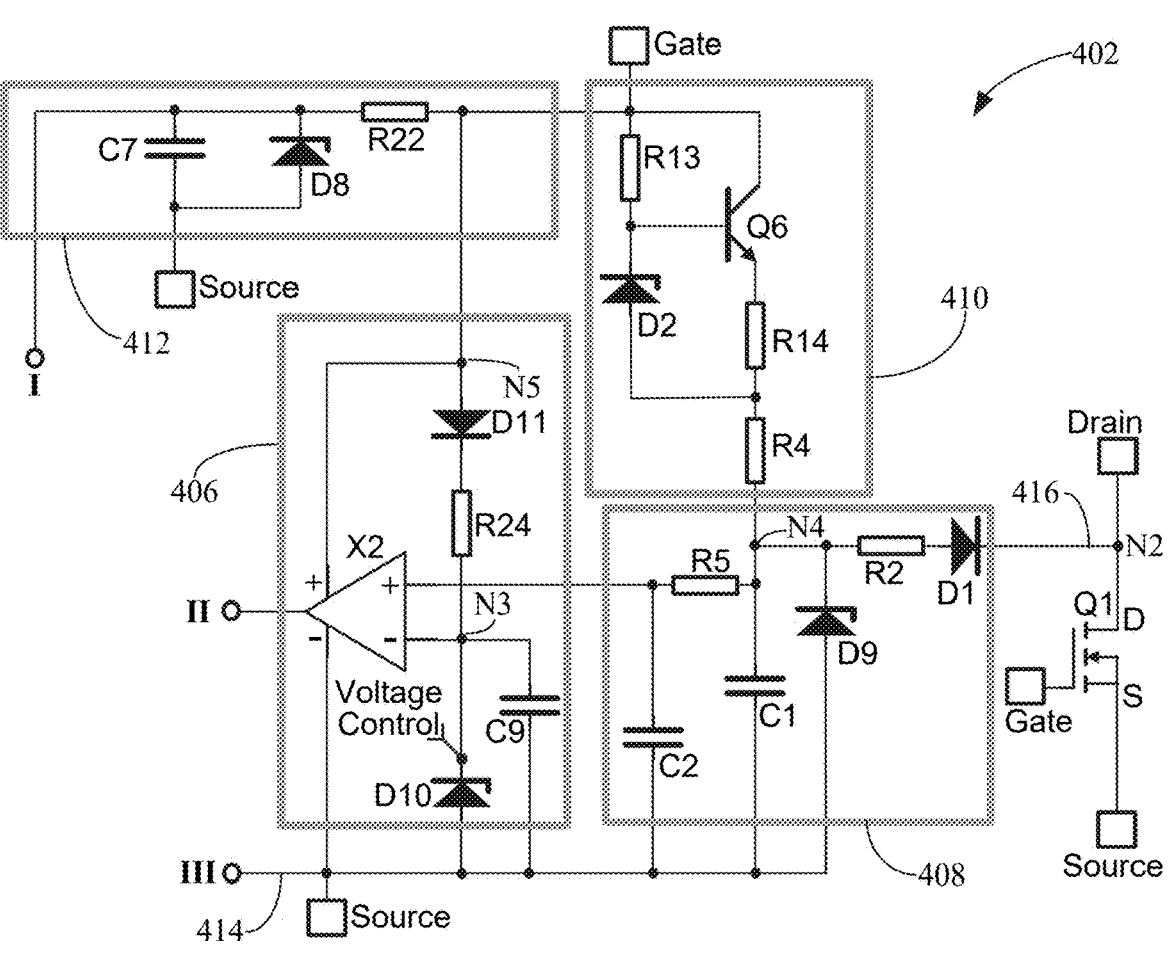
FIG. 4 is a schematic diagram of a circuit for detecting a short-circuit condition of a SiC MOSFET, according to some embodiments.
Figure 4:
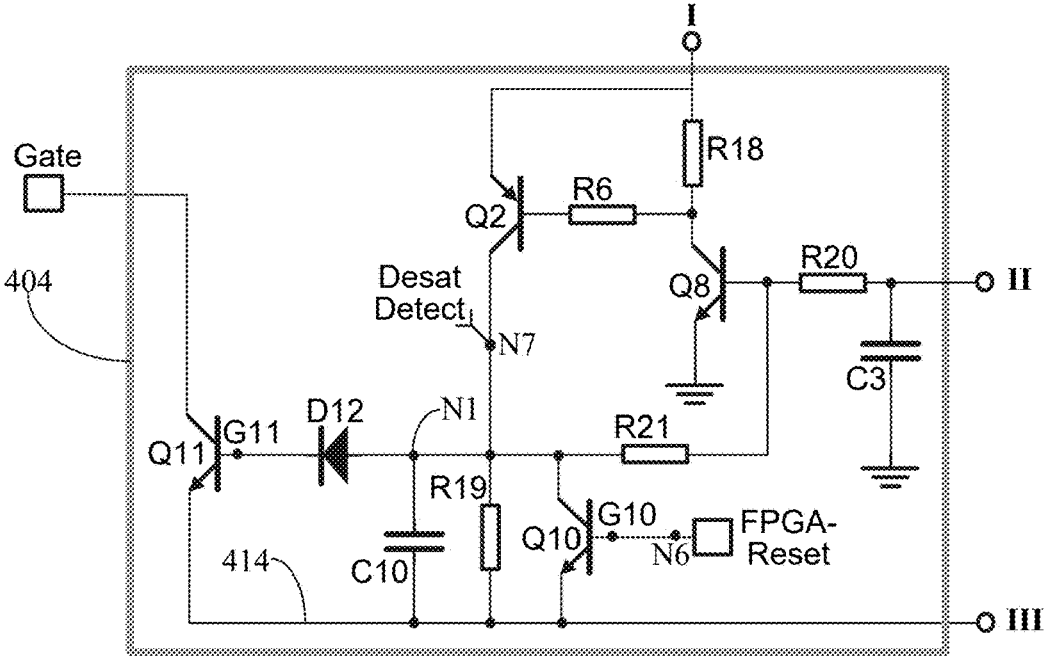

This disclosure describes, among other things, systems and methods for protecting a semiconductor switch in response to detecting a short-circuit condition of the semiconductor switch. For example, such a semiconductor switch may be a SiC MOSFET.

Compared to an IGBT, which has similar blocking voltage and current ratings, a SiC MOSFET has a smaller chip area, which allows for a parasitic capacitance that is smaller than that of an IGBT. Thus, the intrinsic switching speed of a SiC MOSFET may be desirably faster than the intrinsic switching speed of an IGBT. Because of the smaller chip area, however, the SiC MOSFET die may have a relatively low thermal dissipation capability. During short-circuit conditions, a surge current may generate a significant amount of joule heating. Without enough capability to dissipate the heat, the die can be destroyed in a relatively short period of time. Thus, with a smaller die size, the surge current capability of a SiC MOSFET is lower than that of an IGBT, furthering the importance of circuit protection for SiC devices.

The output characteristics of a SiC MOSFET and an IGBT are generally different. An IGBT typically works in the saturation region during a normal ON state. When a short-circuit occurs, its collector current increases and goes through a sharp transition from the saturation region to the active region. The collector current may become self-limited and thus independent of the collector-emitter voltage. Consequently, the increase in IGBT current and power dissipation may become self-limited. On the other hand, a SiC MOSFET works in the linear region during normal ON operation. During a short-circuit event, the SiC MOSFET enters the saturation region. Compared to an IGBT, the SiC MOSFET has a larger linear region. Thus, the transition from the linear region to the saturation region for the SiC MOSFET occurs at a significantly higher drain-source voltage. The drain current continues to increase along with the increasing drain-source voltage. The SiC MOSFET may thus be destroyed before reaching the transition point. These characteristics are among some of the reasons why short-circuit protection for SiC MOSFETs may be substantially different from IGBTs.

Generally, when a semiconductor switch carries an excessive current caused by a short-circuit (which may be upstream or downstream from the semiconductor switch), the voltage drop from the device's drain to source (or between the emitter and collector for an IGBT or a bipolar junction transistor (BJT)) increases above a threshold voltage. A circuit used to detect a short-circuit condition of the semiconductor switch may include, among other circuit components, a capacitor that is charged to the threshold voltage by the drain-source voltage of the device. By comparing the threshold voltage to a reference voltage, the short-circuit condition may be detected.

The threshold voltage for a Si IGBT may be relatively predictable and well-defined. This is not necessarily the case for a SiC MOSFET, which may have a threshold voltage that varies based on its operating temperature and its age. Thus in some embodiments, a circuit, described above, used to detect a short-circuit condition of a semiconductor switch by comparing a threshold voltage to a reference voltage may be modified to account for variations of threshold voltage based on temperature and age of the semiconductor switch.

Since most semiconductor electronic components may normally be susceptible to radiation damage, counterpart radiation-hardened components are generally available. Radiation hardening is a process of making electronic components and circuits resistant to damage or malfunction caused by high levels of ionizing radiation (e.g., particle radiation and high-energy electromagnetic radiation), especially for environments in space (e.g., beyond low-Earth orbit). Due to the extensive development and testing often required to produce a radiation-tolerant design of a microelectronic chip, the technology of radiation-hardened chips tends to lag behind recent developments in electronics and associated applications. Among the many types of circuit components, SiC MOSFETs are among the few that are naturally resistant to radiation damage. To take advantage of SiC MOSFETs being tolerant to radiation, and thus being able to be used in space applications, in some embodiments components of an electrical circuit for protecting a SiC MOSFET (or other type of semiconductor switch) in response to detecting a short-circuit condition may also be radiation hardened.

In some embodiments, an electrical circuit for protecting a semiconductor switch in response to detecting a short-circuit condition of the semiconductor switch includes a latch-reset portion, a voltage comparator portion, a short-circuit detection portion, and a power source portion. The semiconductor switch may be a SiC MOSFET, a Si MOSFET, a GaN device, or an IGBT, just to name a few examples. Examples described herein focus on SiC MOSFETs, but claimed subject matter is not so limited. The latch-reset portion of the circuit is configured to disable or enable the semiconductor switch by connecting or disconnecting, respectively, a gate of the semiconductor switch to a source of the semiconductor switch. Such connecting or disconnecting may be performed via an emitter-collector junction of a transistor that is controlled by a gate of the transistor, for example. In a particular implementation, the connecting or disconnecting the gate of the semiconductor switch to the source of the semiconductor switch may be determined by a gate voltage of a transistor in the latch-reset portion that is powered by a voltage pulse that drives the gate of the semiconductor switch.

The voltage comparator portion of the circuit is configured to provide a disable signal to the latch-reset portion. The disable signal commands the latch-reset portion to disable the semiconductor switch. The short-circuit detection portion of the circuit is configured to provide a voltage to the voltage comparator portion. The voltage may be based, at least in part, on a drain-source voltage of the semiconductor switch. The voltage comparator portion of the circuit may provide the disable signal to the latch-reset portion based on a comparison between the voltage and a reference voltage. In some implementations, the reference voltage may be varied automatically by a processor based on age or temperature of the semiconductor switch.

The power source portion of the circuit may be configured to provide voltage and current to the latch-reset portion and the short-circuit detection portions of the circuit, as explained below. The power source portion may be energized by a voltage pulse that drives the gate of the semiconductor switch.

In some implementations, the voltage comparator portion may include a processor-adjustable voltage source to produce the reference signal. The processor-adjustable voltage source may be a voltage controlled voltage source (VCVS) or a current controlled voltage source (CCVS) that may be operated by a computer processor, for example. The voltage comparator portion may include a Zener diode that produces the reference voltage and is configured to carry a current generated from the voltage pulse that drives the gate of the semiconductor switch. The voltage pulse that energizes the power source portion may be a single pulse of a modulated voltage signal that drives the gate of the semiconductor switch. In some implementations, a time span from detecting the short-circuit condition of the semiconductor switch to disabling the semiconductor switch may be less than one pulse cycle of a modulated voltage signal that drives the gate of the semiconductor switch. In some implementations, the latch-reset portion may include a reset input node that is controlled by a processor, such as an FPGA, to enable the semiconductor switch when it is disabled.

In some embodiments, a method for protecting a semiconductor switch in response to detecting a short-circuit condition of the semiconductor switch includes measuring a drain-source voltage of the semiconductor switch, determining that the drain-source voltage exceeds a threshold voltage that indicates that the semiconductor switch is in a short-circuit condition and, in response to determining that the drain-source voltage exceeds the threshold voltage, disabling the semiconductor switch by connecting a gate of the semiconductor switch to a source of the semiconductor switch. The connecting may be enabled by a gate voltage of a transistor that is powered by a voltage pulse that drives the gate of the semiconductor switch, for example.

FIG. 1 is a plot that qualitatively illustrates a shift in threshold gate voltage over operation lifetime of a SiC MOSFET, according to some embodiments. For example, the time scale and/or the shape of curve 102 may depend on how the SiC MOSFET is driven (e.g., duty cycle, threshold voltage, bias voltage, etc.). The threshold voltage is the gate voltage at which significant current starts to flow from the source to the drain of the SiC MOSFET. Such a shift in threshold gate voltage over time generally presents a challenge for designing a circuit to accurately detect a short-circuit condition for a SiC MOSFET. In contrast, other types of semiconductor switches, such as an IGBT or BJT, do not necessarily present as large of threshold voltage shifts with time.

FIG. 2 is a plot that qualitatively illustrates a change in threshold gate voltage with respect to changes in temperature of a SiC MOSFET, according to some embodiments. For example, the temperature scale and/or the shape of curve 202 may depend on how the SiC MOSFET is driven (e.g., duty cycle, threshold voltage, bias voltage, etc.). One reason threshold voltage decreases as temperature increases is because, with the increase in temperature, an increasing portion of electrons in the SiC MOSFET emit from interface states into the conduction band. As for shifts in threshold gate voltage over operational lifetime, shifts resulting from temperature changes also generally present a challenge for designing a circuit to accurately detect a short-circuit condition for a SiC MOSFET. In contrast, other types of semiconductor switches, such as an IGBT or BJT, do not necessarily present as large of threshold voltage shifts with temperature.

FIG. 3 is a system block diagram of a circuit 302 for detecting a short-circuit condition of a semiconductor switch Q1, according to some embodiments. Upon detecting a short-circuit condition, circuit 302 may disable the semiconductor switch. Circuit 302 includes a latch-reset portion 304, a voltage comparator portion 306, a short-circuit (De-Sat) detection portion 308, and a power source portion 310 that includes a current source portion 312 and an internal Vcc generation portion 314. Q1 may be a SiC MOSFET, a Si MOSFET, a GaN device, or an IGBT, just to name a few examples. Latch-reset portion 304 may be configured, via line 316, to disable or enable Q1 by connecting or disconnecting, respectively, the gate G of Q1 to the source S of Q1. Voltage comparator portion 306 may be configured to provide to latch-reset portion 304 a disable signal that commands the latch-reset portion to disable the semiconductor switch. Short-circuit detection portion 308 may be configured to provide to voltage comparator portion 306 a voltage that is based on the drain-source voltage of Q1, which may be measured via line 318. Voltage comparator portion 306 may provide a disable signal to latch-reset portion 304 based on a comparison between the voltage and a reference voltage. In some implementations, the reference voltage may be varied automatically by a processor 320 based on age or temperature of the semiconductor switch.

Power source portion 310 may be configured to provide voltage and current to latch-reset portion 304 and short-circuit detection portion 308, as explained below. Power source portion 310 and voltage comparator portion 306 may be energized via line 322 by a voltage pulse that drives gate G of Q1. For example, the voltage pulse may be a single pulse of a modulated gate signal that drives gate G of Q1. Because portions of circuit 302 tap power from the gate signal that drives Q1, an external voltage source (e.g., a Vcc) is not needed to operate circuit 302. For example, each pulse of the gate signal may power-up (e.g., energize) circuit 302, which may detect a short-circuit condition during a single gate pulse cycle.

In some implementations, voltage comparator portion 306 may include a voltage source or node of which the voltage is adjustable by processor 320. Accordingly, the processor may select a reference voltage that will be compared to the voltage provided by short-circuit detection portion 308 and based on the drain-source voltage of Q1.

FIG. 4 is a schematic diagram of a circuit 402 for detecting a short-circuit condition of a semiconductor switch Q1, which may be a SiC MOSFET, according to some embodiments. Circuit 402 may be the same as or similar to circuit 302 and includes a latch-reset portion 404, a voltage comparator portion 406, a short-circuit (DeSat) detection portion 408, a current source portion 410, and an internal Vcc generation portion 412. Q1 may be a SiC MOSFET, a Si MOSFET, a GaN device, or an IGBT, just to name a few examples. Circuit 402 is drawn in two parts for clarity, wherein latch-reset portion 404 is coupled to the remaining part of circuit 402 via nodes I, II, and II.

Latch-reset portion 404 may be configured, via Q11 and line 414, to disable or enable Q1 by connecting or disconnecting, respectively, the gate of Q1 to the source S of Q1.

For example, the connecting or disconnecting may be performed via the emitter-collector junction of Q11, which may be a BJT, that is controlled by a gate G11 of the transistor. As explained below, G11 may be powered, via node I, by a voltage pulse that drives the gate of the Q1.

Voltage comparator portion 406 may be configured to provide to latch-reset portion 404 a disable signal, via node II, that commands the latch-reset portion to disable Q1. The disabling would be carried out by Q11. For example, the disable signal may be a voltage level that turns on Q2 and Q8 and sets the voltage at node N1 (and also at G11 minus the voltage drop of D12) high enough to also turn on Q11.

Short-circuit detection portion 408 may be configured to provide to voltage comparator portion 406 a voltage that is based on the drain-source voltage of Q1, which may be measured at node N2 via line 416. For example, the voltage at N2 may charge capacitor C2 to a voltage that is received at the positive input of comparator X2. Depending on the voltage on C2, which X2 will compare with a reference voltage at node N3 that is established by a Zener diode D10 or other device, X2 may output a disable signal to latch-reset portion 404 via node II. In some implementations, instead of including Zener diode D10 in voltage comparator portion 406 to establish the reference voltage at node N3, this voltage may instead be established by a voltage controller, such as a computer processor, for example. Among other possibilities, to at least partially account for a changing (e.g., due to temperature and/or aging) threshold voltage of Q1, the voltage controller may set the reference voltage at node N3 based on age and/or temperature of Q1. Thus, the comparison that X2 makes between the voltage on C2, which reflects the drain-source voltage of Q1, and the reference voltage on node N3 may account for age and/or temperature of Q1.

Current source portion 410 may be energized by the voltage that is applied to gate G of Q1. The voltage may be constant or vary with time, such as a repeating voltage pulse train. For example, the voltage that energizes current source portion 410 may be a single voltage pulse of a modulated gate signal that drives gate G of Q1. Current source portion 410 may in turn be configured to provide voltage and current to short-circuit detection portion 408 via node N4.

Internal Vcc generation portion 412 may also be energized by the voltage that is applied to gate G of Q1. Internal Vcc generation portion 412 may in turn be configured to provide voltage and current to latch-reset portion 404 and voltage comparator portion 406 via nodes I and N5, respectively. As pointed out above, because portions of circuit 402 tap power from the gate signal that drives Q1, an external voltage source (e.g., a Vcc) is not needed to operate circuit 402. For example, each pulse of the gate signal may power-up (e.g., energize) circuit 402, which may detect a short-circuit condition during a single gate pulse cycle.

In some implementations, latch-reset portion 404 may include a reset node N6 at gate G10 of transistor Q10, for example. The voltage at reset node N6 may be established by an FPGA or processor to reset a short-circuit detection condition of latch-reset portion 404, wherein Q11 disables Q1 by connecting the gate and source of Q1 together. In this condition, when Q1 is disabled in this way, the voltage at gate G11 is high enough to turn on Q11. If an FPGA or processor places a voltage on gate G10 that is high enough to turn on Q10, then Q10 will pull the voltage on node N1 down toward the source voltage (e.g., ground), thus lowering the voltage on gate G11, turning off Q11, and re-enabling Q1. In some implementations, the FPGA or processor may receive measurement values or information regarding the condition of circuitry and/or devices (e.g., motors or other equipment) so that it may determine if the situation that caused a short-circuit condition is over or still continuing. Thus, by receiving such data or information, the FPGA or processor may determine if it is safe to re-enable Q1 by resetting the latch circuit in latch-reset portion 404.

Figure 5:
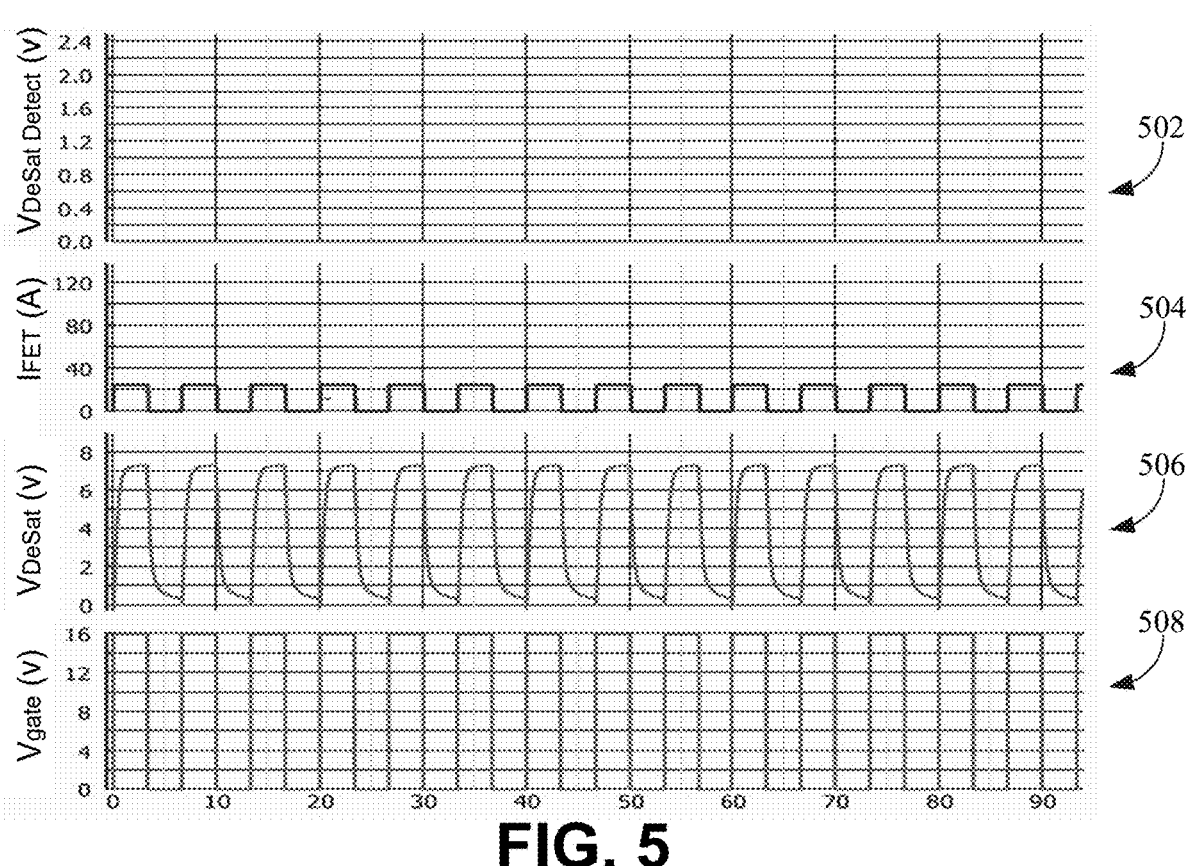
FIG. 5 illustrates the gate voltage and drain-source current and voltage of a SiC MOSFET during a normal operating condition, according to some embodiments.

FIG. 5 illustrates the gate voltage and drain-source current and voltage of a SiC MOSFET during a normal operating condition, wherein a short-circuit is not present, according to some embodiments. Circuit 402 of FIG. 4 will be used in this example.

During the normal condition, referring to circuit 402, the voltage across C1 is relatively low, which is dictated by the voltage drop across the drain-source of Q1. Since this voltage is less than the reference voltage of D10 (e.g., a Zener diode or a processor-controlled voltage), the output of comparator X2 is low, which indicates that there is no short-circuit condition that has been detected.

Plot 502 illustrates a voltage, referred to as $V_{DeSat\ Detect}$, that may be applied to gate G11 in latch-reset portion 404 of circuit 402, for example. $V_{DeSat\ Detect}$ may be measured at node N7. Because $V_{DeSat\ Detect}$ remains substantially zero during normal condition, Q11 remains off so that the gate and source of Q1 are not shorted with each other (e.g., Q1 is not disabled). Plot 504 illustrates the drain-source current ($I_{FET}$) in Q1 and plot 506 illustrates a voltage $V_{DeSat}$ that may be applied to the positive input of comparator X2. Plot 508 illustrates the gate voltage Vgate that drives Q1. In normal operation, voltage $V_{DeSat}$ remains below the reference voltage (e.g., of D10), which in this example is about 8 volts, so that comparator X2 does not output a disable signal (e.g., output is railed at substantially zero volts) to latch-reset portion 404. Accordingly, the non short-circuit status of Q1 is maintained by circuit 402.

Figure 6:
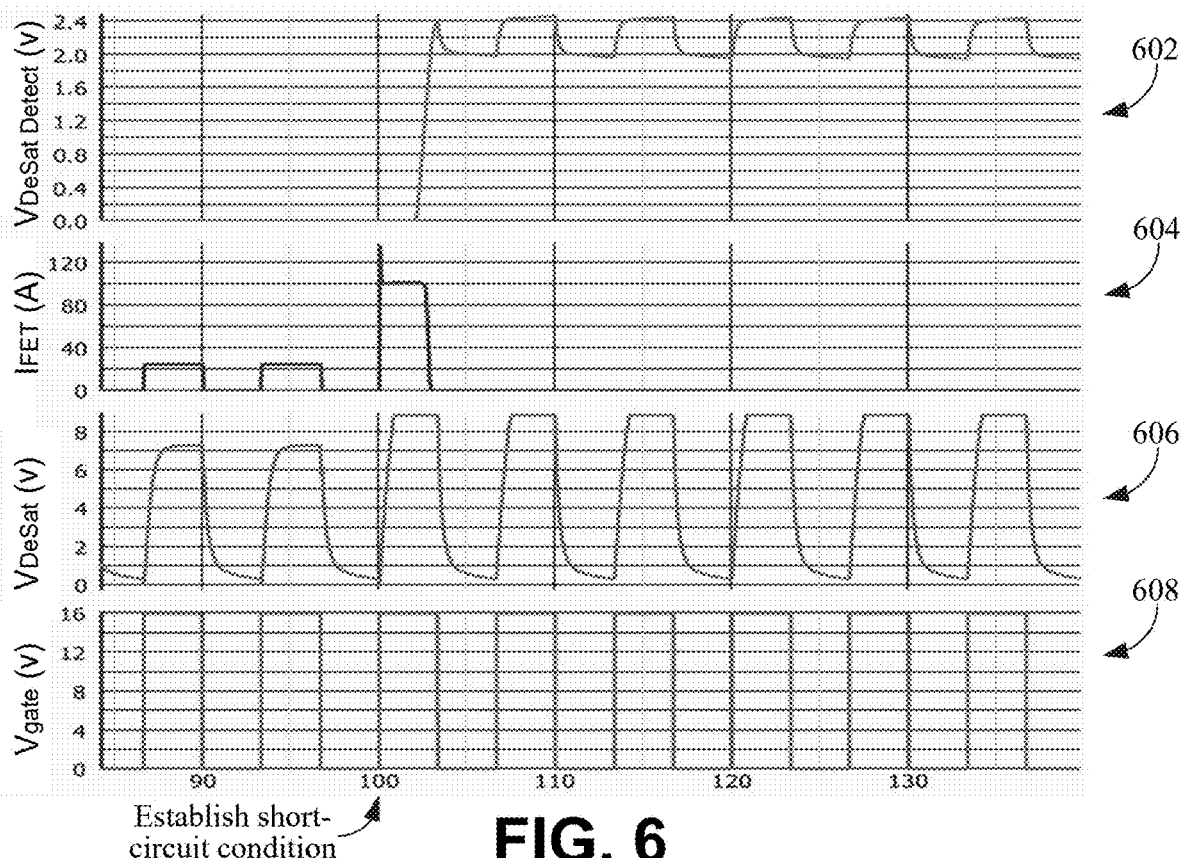
FIG. 6 illustrates the gate voltage and drain-source current and voltage of a SiC MOSFET during a short-circuit condition, according to some embodiments.

FIG. 6 illustrates the gate voltage and drain-source current and voltage of the SiC MOSFET in circuit 402 during a short-circuit condition, according to some embodiments. In a short-circuit condition, the voltage drop across the drain-source of Q1 increases until it exceeds the reference voltage at node N3 of the comparator X2. Consequently the output of X2 will rail to VCC+ of the comparator and the latch circuit of latch-reset portion 404 maintains this status until a reset signal is received from an FPGA or processor at gate G10 to re-enable Q1.

To illustrate the onset of a short-circuit condition, a short-circuit is applied at T=100 microseconds and it takes circuit 402 about 2 microseconds to react and open Q1. Plot 602 illustrates $V_{DeSat\ Detect}$ jumping from zero to 2 or more volts when the short-circuit occurs, as indicated by $I_{FET}$ spiking up to over 100 amps. $V_{DeSat\ Detect}$ is applied to gate G11 in latch-reset portion 404 of circuit 402, and thus Q11 will turn on so that the gate and source of Q1 are shorted with each other to disable Q1. Plot 604 illustrates the drain-source current (IFET) in Q1 dropping to zero when Q1 is disabled and thus protected from carrying excess current. Plot 606 illustrates voltage $V_{DeSat}$ applied to the positive input of comparator X2. When this voltage exceeds the reference voltage of 8 volts, comparator X2 outputs a disable signal (e.g., output is railed at VCC+) to latch-reset portion 404. Accordingly, the short-circuit status of Q1 is established and maintained by circuit 402. Plot 508 illustrates the gate voltage Vgate that continues to drive Q1 regardless of the short-circuit condition.

FIG. 7 is a flow diagram of a method 700 for protecting a semiconductor switch in response to detecting a short-circuit condition of the semiconductor switch, according to some embodiments. For example, the semiconductor switch may be Q1 in circuits 302 and 402. Accordingly, method 700 may be performed by circuits that are the same as or similar to 302 and 402, at least in principle or operation. At 702, the circuit may measure a drain-source voltage of the semiconductor switch. The measurement may be performed by tapping into a node at the drain of the semiconductor switch, for example. At 704, the circuit may determine that the drain-source voltage exceeds a threshold voltage by comparing this voltage with a reference voltage that, when exceeded, indicates that the semiconductor switch is in a short-circuit condition. At 706, in response to determining that the drain-source voltage exceeds the threshold voltage, the circuit may disable the semiconductor switch by connecting a gate of the semiconductor switch to a source of the semiconductor switch. For example, the connecting may be enabled by a gate voltage of a transistor that is powered by a voltage pulse that drives the gate of the semiconductor switch. Such a source of power is in contrast to other circuits that may use an external voltage supply.

The foregoing description, for purposes of explanation, uses specific nomenclature to provide a thorough understanding of the disclosure. It will be apparent to one skilled in the art, however, that specific details are not required in order to practice the systems and methods described herein. The foregoing descriptions of specific embodiments or examples are presented by way of examples for purposes of illustration and description. They are not intended to be exhaustive of or to limit this disclosure to the precise forms described. Many modifications and variations are possible in view of the above teachings. The embodiments or examples are illustrated and described to best explain the principles of this disclosure and practical applications, to thereby enable others skilled in the art to best utilize this disclosure and various embodiments or examples with various modifications as are suited to the particular use contemplated. It is intended that the scope of this disclosure be defined by the following claims and their equivalents.

We claim as follows:

1. An electrical circuit for protecting a semiconductor switch in response to detecting a short-circuit condition of the semiconductor switch, the electrical circuit comprising:
   a latch-reset portion to disable or enable the semiconductor switch by connecting or disconnecting, respectively, a gate of the semiconductor switch to a source of the semiconductor switch;
   a voltage comparator portion to provide a disable signal to the latch-reset portion that commands the latch-reset portion to disable the semiconductor switch;
   a short-circuit detection portion to provide a voltage to the voltage comparator portion, wherein the voltage is based, at least in part, on a drain-source voltage of the semiconductor switch and wherein the voltage comparator portion provides the disable signal to the latch-reset portion based on a comparison between the voltage and a reference voltage; and
   a power source portion to provide voltage and current to the latch-reset portion and the short-circuit detection portion, wherein the power source portion is energized by a voltage pulse that drives the gate of the semiconductor switch.

2. The electrical circuit of claim 1, wherein the voltage comparator portion includes a processor-adjustable voltage source to produce the reference signal.

3. The electrical circuit of claim 2, wherein the processor-adjustable voltage source is a voltage controlled voltage source (VCVS) or a current controlled voltage source (CCVS).

4. The electrical circuit of claim 1, wherein the voltage comparator portion includes a Zener diode that produces the reference voltage and is configured to carry a current generated from the voltage pulse that drives the gate of the semiconductor switch.

5. The electrical circuit of claim 1, wherein the connecting or disconnecting the gate of the semiconductor switch to the source of the semiconductor switch is determined by a gate voltage of a transistor in the latch-reset portion that is powered by the voltage pulse that drives the gate of the semiconductor switch.

6. The electrical circuit of claim 1, wherein the voltage pulse that energizes the power source portion is a single pulse of a modulated voltage signal that drives the gate of the semiconductor switch.

7. The electrical circuit of claim 1, wherein the latch-reset portion includes a reset input node that is controlled by (an FPGA) a processor to enable the semiconductor switch when it is disabled.

8. The electrical circuit of claim 1, wherein the semiconductor switch is a silicon carbide (SiC) FET.

9. The electrical circuit of claim 1, wherein the reference voltage is varied automatically by a processor based on age or temperature of the semiconductor switch.

10. The electrical circuit of claim 1, wherein the semiconductor switch is a radiation-hardened semiconductor switch.

11. The electrical circuit of claim 1, wherein a time span from detecting the short-circuit condition of the semiconductor switch to disabling the semiconductor switch is less than one pulse cycle of a modulated voltage signal that drives the gate of the semiconductor switch.

12. An electrical circuit for detecting a short-circuit condition of a semiconductor switch, the electrical circuit comprising:
    a latch-reset portion to disable or enable the semiconductor switch by connecting or disconnecting, respectively, a gate of the semiconductor switch to a source of the semiconductor switch;
    a voltage comparator portion to provide a disable signal to the latch-reset portion that commands the latch-reset portion to disable the semiconductor switch;
    a short-circuit detection portion to provide a voltage to the voltage comparator portion, wherein the voltage is based, at least in part, on a drain-source voltage of the semiconductor switch and wherein the disable signal is provided to the latch-reset portion based on a comparison between the voltage and a reference voltage that is varied by a processor based on age or temperature of the semiconductor switch; and
    a power source portion to provide voltage and current to the latch-reset portion and the short-circuit detection portion.

13. The electrical circuit of claim 12, wherein the power source portion is energized by a voltage pulse that drives the gate of the semiconductor switch.

14. The electrical circuit of claim 12, wherein the voltage comparator portion includes a processor-adjustable voltage source to produce the reference signal.

15. The electrical circuit of claim 12, wherein the voltage comparator portion includes a Zener diode that produces the reference voltage and is configured to carry a current generated from the voltage pulse that drives the gate of the semiconductor switch.

16. The electrical circuit of claim 12, wherein the connecting or disconnecting the gate of the semiconductor switch to the source of the semiconductor switch is determined by a gate voltage of a transistor in the latch-reset portion that is powered by the voltage pulse that drives the gate of the semiconductor switch.

17. The electrical circuit of claim 12, wherein the voltage pulse that energizes the power source portion is a single pulse of a modulated voltage signal that drives the gate of the semiconductor switch.

18. The electrical circuit of claim 12, wherein the latch-reset portion includes a reset input node that is controlled by (an FPGA) a processor to enable the semiconductor switch when it is disabled.

19. The electrical circuit of claim 12, wherein the semiconductor switch is a silicon carbide (SiC) FET.

20. A method for protecting a semiconductor switch in response to detecting a short-circuit condition of the semiconductor switch, the method comprising:
    measuring a drain-source voltage of the semiconductor switch;
    determining that the drain-source voltage exceeds a threshold voltage that indicates that the semiconductor switch is in a short-circuit condition; and
    in response to determining that the drain-source voltage exceeds the threshold voltage, disabling the semiconductor switch by connecting a gate of the semiconductor switch to a source of the semiconductor switch, wherein the connecting is enabled by a gate voltage of a transistor that is powered by a voltage pulse that drives the gate of the semiconductor switch.

\* \* \* \* \*